United States Patent [19]

Mito

[11] Patent Number: 4,799,226
[45] Date of Patent: Jan. 17, 1989

[54] DISTRIBUTED FEEDBACK LASER DIODE COMPRISING AN ACTIVE LAYER PARTLY ADJACENT TO A WAVEGUIDE LAYER

[75] Inventor: Ikuo Mito, Tokyo, Japan
[73] Assignee: NEC Corporation, Tokyo, Japan
[21] Appl. No.: 56,011
[22] Filed: Jun. 1, 1987

[30] Foreign Application Priority Data

May 30, 1986 [JP] Japan .................................. 61-125467

[51] Int. Cl.⁴ ................................................. H01S 3/19
[52] U.S. Cl. ........................................ 372/45; 372/46; 372/96; 372/102
[58] Field of Search ................................. 372/43–46, 372/96, 102

[56] References Cited

U.S. PATENT DOCUMENTS 4,667,332   5/1987   Mihashi et al. ........................ 372/45

FOREIGN PATENT DOCUMENTS 0006886   1/1986   Japan .................................... 372/96

Primary Examiner—William L. Sikes
Assistant Examiner—Georgia Y. Epps
Attorney, Agent, or Firm—Sughrue, Mion, Zinn, Macpeak & Seas

[57] ABSTRACT

In a distributed feedback laser diode comprising an optical waveguide layer, a first stack of a current confining and a current blocking layer, and a second stack of a first cladding layer, an active layer, and a second cladding layer consecutively on a semiconductor substrate having a corrugated surface, a pair of inwardly directed surfaces is formed to define a groove in the first stack, to divide the current blocking layer into two current blocking parts, and to expose an area of the waveguide layer as a groove bottom. The first cladding layer is formed on the current blocking parts, the inwardly directed surfaces, and the groove bottom. The laser diode is suitable to manufacture by metal organic chemical vapor deposition. The groove is preferably perpendicular to corrugations of the corrugated surface. The groove bottom may have a width of 1.5 microns. The groove can be formed by chemical etching of the first stack before epitaxial growth of the first cladding layer.

5 Claims, 1 Drawing Sheet

4,799,226

DISTRIBUTED FEEDBACK LASER DIODE COMPRISING AN ACTIVE LAYER PARTLY ADJACENT TO A WAVEGUIDE LAYER

BACKGROUND OF THE INVENTION

This invention relates to a distributed feedback (DFB) laser diode or semiconductor laser of a structure which is suitable to manufacture according to metal organic chemical vapor deposition (MO-CVD).

Distributed feedback laser diodes operable in a single longitudinal mode are extensively studied for use in optical communication and in optical measurement. In the manner which will later be described more in detail, such a distributed feedback laser diode comprises a grating semiconductor substrate which has corrugations on its surface. Various semiconductor layers are epitaxially grown on the surface. The semiconductor layers include an active layer and an optical waveguide layer.

Liquid-phase epitaxial growth or epitaxy is usually carried out on growing the semiconductor layers on the semiconductor substrate. It has, however, been unavoidable by the liquid-phase epitaxy that the corrugations are lost or otherwise adversely affected during epitaxy of the semiconductor layers. A method is revealed by the present applicant in U.S. Pat. No. 4,561,915 for an improvement in the liquid-phase epitaxy.

On the other hand, vapor-phase epitaxy is disclosed for the semiconductor lasers by L. D. Westbrook et al in Electronics Letters, Volume 19, No. 11 (May 26th 1983), pages 423 and 424, under the title of "New Approach to the Manufacture of Low-threshold 1.5 μm Distributed Feedback Lasers." The method is called metal organic chemical vapor deposition and is effective in removing the adverse effect which would otherwise be caused to the corrugations. In other words, the metal organic chemical vapor deposition is prosperous in manufacturing distributed feedback laser diodes which are stably operable in a single longitudinal mode, are of excellent characteristics, and are highly reproducible. Laser diodes are, however, unknown which are of a structure suitable to manufacture according to the metal organic chemical vapor deposition.

SUMMARY OF THE INVENTION

It is therefore an object of the present invention to provide a distributed feedback laser diode of a structure which is suitable to manufacture by metal organic chemical vapor deposition.

It is another object of this invention to provide a distributed feedback laser diode of the type described, which is stably operable in a single longitudinal mode, is of excellent characteristics, and is highly reproducible.

Other objects of this invention will become clear as the description proceeds.

According to this invention, there is provided a semiconductor laser comprising a semiconductor substrate having a first conductivity type and a corrugated surface, an optical waveguide layer having the first conductivity type and a greater refractive index than the substrate, a first stack which comprises a current confining layer having a second conductivity type and a smaller refractive index than the waveguide layer and a current blocking layer of the first conductivety type and which has a pair of inwardly directed surfaces defining a groove therein and dividing the blocking layer and the confining layer into two current blocking parts and two current confining parts, respectfully with an area of the waveguide layer exposed as a groove bottom, and a second stack which consecutively comprises a first cladding layer having the first conductivity type and a smaller refractive index than the waveguide layer, an active layer having a greater refractive index than the waveguide layer, and a second cladding layer having the second conductivity type and a smaller refractive index than the waveguide layer, the waveguide layer being on the corrugated surface, the current confining layer being on the waveguide layer, the first cladding layer being on the current blocking parts, the inwardly directed surfaces, and the groove bottom.

DESCRIPTION OF THE PREFERRED EMBODIMENT

Figure 1:
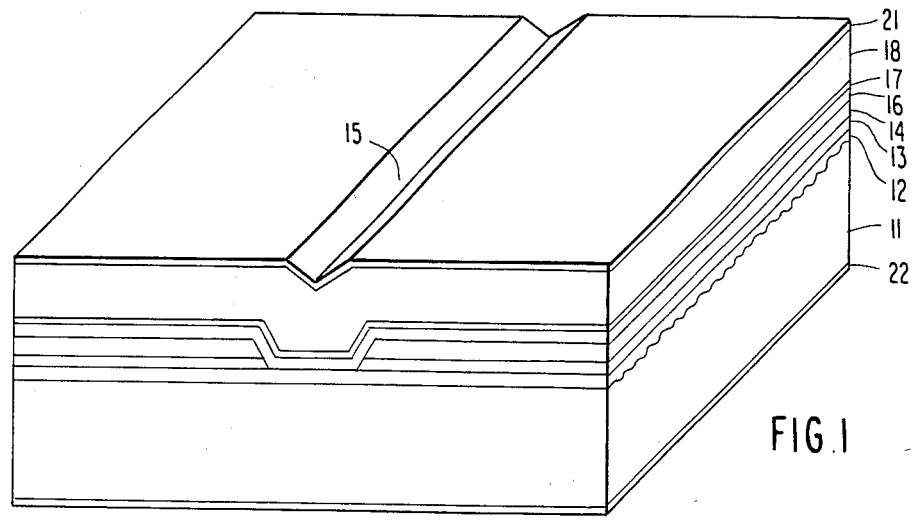
FIG. 1 shows a schematic perspective view of a semiconductor laser according to an embodiment of the instant invention.

Referring to FIG. 1, a distributed feedback (DFB) laser diode is shown as a semiconductor laser according to a preferred embodiment of the present invention. The laser diode comprises a p-type InP substrate which has a (0 0 1) surface depicted upwardly of the figure.

Figure 2A:
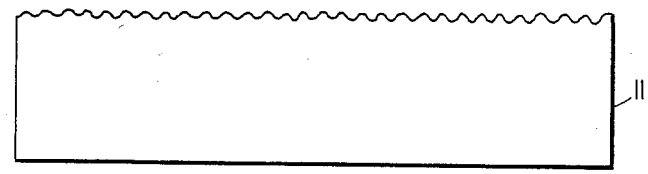
FIGS. 2 (A) and (B) schematically show side views of the semiconductor laser depicted in FIG. 1 on first and second stages of manufacture.
Figure 2B:
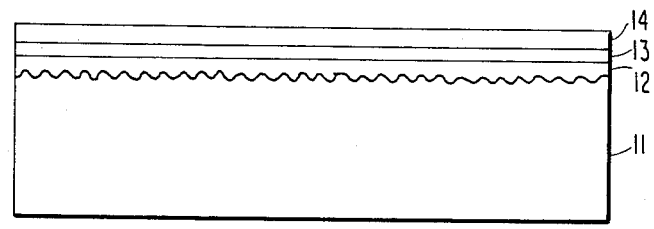

Turning to FIG. 2 (A), the substrate is indicated at 11. In the manner which will be described in the following, various semiconductor layers were epitaxially grown on the substrate 11 according to metal organic chemical vapor deposition (MO-CVD) to provide a laser element for use in manufacturing a plurality of laser diodes of the type illustrated in FIG. 1. The substrate 11 was thicker than the substrate which is depicted in FIG. 1 and designated also by the reference numeral 11 merely for simplicity of illustration.

On manufacturing the laser element, the substrate 11 was doped with zinc to a carrier density of $2 \times 10^{18}$ cm$^{-3}$. Corrugations were formed on the surface so as to make each laser diode have an internal diffraction grating. With a helium-cadmium gas laser used as an optical source, the corrugations were formed by exposure to two-beam interference fringes in the manner known in the art along the $<1\bar{1}0>$ direction to a depth of 500 Å at a pitch or a grating constant of 2500 Å.

Further turning to FIG. 2 (B), a p-type InGaAsP optical waveguide layer 12 was epitaxially grown on the corrugated surface of the substrate 11 to a thickness of 0.15 micron above peaks of the corrugations. The waveguide layer 12 had a composition which gave a lasing wavelength of 1.3 microns and was doped with zinc to a carrier density of $5 \times 10^{17}$ cm$^{-3}$.

Subsequently, an n-type InP current confining layer 13 was epitaxially grown on an upper or exposed surface of the waveguide layer 12 to a thickness of 0.2 micron with silicon used as a dopant to a carrier density of $2 \times 10^{18}$ cm$^{-3}$. Next, a p-type InP current blocking layer 14 was epitaxially grown on the current confining layer 13 to a thickness of 0.3 micron with zinc used as a dopant to a carrier density of $1 \times 10^{18}$ cm$^{-3}$. Merely for convenience of the description, a combination of the current confining and the current blocking layers 13 and 14 is herein called a first stack.

Figure 3A:
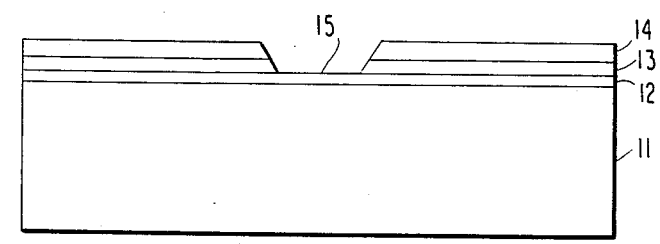
FIGS. 3 (A) and (B) schematically show front views of the semiconductor laser illustrated in FIG. 1 on third and fourth stages of manufacture.
Figure 3B:
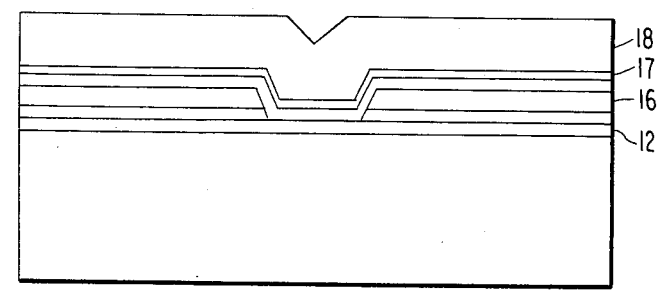

Referring now to FIG. 3 (A), a groove 15 was formed into the first stack perpendicular to the corrugations, or ridges and grooves, to reach the upper surface of the optical waveguide layer 13 and to have a bottom width which was 1.5 microns wide. By using a hydrochloric acid etchant known in the art, the groove 15 was formed by resorting to an ordinary photolithgraphic technique. With respect to the corrugations, the groove 15 has a directional relationship best shown in FIG. 1. It will be understood that the groove 15 is defined by a pair of inwardly directed surfaces of the first stack on both sides and by an exposed area of the waveguide layer 12 at the bottom. Stated otherwise, the inwardly directed surfaces were formed to define the groove 15 in the first stack and to divide the current blocking layer 14 into two current blocking parts with the area in question exposed as a groove bottom. In this manner, the groove 15 was chemically etched into the first stack to divide also the first stack into two stack parts. Each inwardly directed surface has a slope which results from the chemical etching and is not critical.

Turning to FIG. 3 (B), a p-type InP cladding layer 16 was epitaxially grown as a first cladding layer on the current blocking layer 14, on the inwardly directed surfaces of the first stack, and on the exposed area of the optical waveguide layer 12 to a thickness of 0.1 micron with zinc used as a dopant to a carrier density of $1 \times 10^{18}$ cm$^{-3}$. Subsequently, a nondoped InGaAsP active layer 17 was epitaxially grown on the first cladding layer 16 to a thin thickness of 0.08 micron. The active layer 17 had a composition which corresponded to a lasing wavelength of 1.55 microns. Inasmuch as the active layer 17 was not doped, the active layer 17 had a very low carrier density, if any. Next, an n-type InP cladding layer 18 was epitaxially grown on the active layer 17 as a second cladding layer to a thickness of 3 microns with silicon used as a dopant to a carrier density of $1 \times 10^{18}$ cm$^{-3}$. A combination of the active layer 17 and the cladding layers 16 and 18 is herein termed a second stack.

Reviewing FIGS. 2 (A) and (B) and FIGS. 3 (A) and (B), the organic metal chemical vapor deposition was carried out by using trimethyl gallium, trimethyl indium, phosphine or hydrogen phosphide, and arsine or arsenic hydride according to the layers 12 to 14 and 16 to 18 in the known manner. When the carrier density of the optical waveguide layer 12 is used as a reference, the substrate 11 has a higher carrier density than the reference. The current confining layer 13 also has a higher carrier density than the reference. The active layer 17 has a lower carrier density than the reference. The first and the second cladding layers 16 and 18 have a higher carrier density than the reference and therefore than the active layer 17. It is known in the art that the carrier density of the current blocking layer 14 is higher than the reference and that each of these layers 12 to 14 and 16 to 18 has a band gap which is related to the carrier density.

More particularly, the optical waveguide layer 12 has a greater refractive index than the substrate 11, the current confining layer 13, and the cladding layers 16 and 18. The active layer 17 has a greater refractive index than the waveguide layer 12 and consequently than the cladding layers 16 and 18. In connection with the organic metal chemical vaper deposition which is the vapor-phase epitaxy of a sort, it should be noted that each layer grows to a substantially constant thickness in contrast to the liquid-phase epitaxy whereby a layer grows on a surface having an indent to be thicker on the indent. The active layer 17 is therefore very close to the waveguide layer 12 at the bottom of the groove 15. In other areas, namely, above the current blocking parts, the active layer 17 is remote from the waveguide layer 12. In other words, the active layer 17 is adjacent to the waveguide layer 12 only partly at the groove bottom.

Turning back to FIG. 1, the substrate 11 of the laser element was subjected to grinding until the laser element had a thickness of about 140 microns. A p-side electrode 21 was formed on the substrate 11 by using gold-zinc. An n-side electrode 22 was formed on the second cladding layer 18 by gold-germanium-nickel. The laser element with the electrodes 21 and 22 was cleaved into laser diodes, each of a length of about 250 microns.

The laser diode was stably operable to generate a laser beam in a single longitudinal mode and had as small an oscillation threshold value as 20 mA. The differential quantum efficiency was 25°/0 for the laser beam emitted from the front facet. It is believed that electric current is effectively confined by cooperation of the current confining and the current blocking layers 13 and 14 to an optical waveguide formed, among others, in the active layer 17 below the groove 15. Even when the laser beam was not wholly confined to this portion of the active layer 17 due to the thin thickness of the active layer 17, the optical waveguide was formed additionally by that portion of the waveguide layer 12 which is adjacent to the active layer 17 at the bottom of the groove 15. This would be the reason why the laser beam was stably kept in the single longitudinal mode.

The laser diode was mounted to a diamond heat sink (not shown) with the second cladding layer 18 brought into contact with the heat sink. Continuous-wave operation was possible up to a highest temperature of 110° C. The laser diode was stably operable in the fundamental transverse mode at a wavelength of 1.55 microns up to a threshold output of 35 mW. The laser beam had an angle of 40° and another angle of 20° perpendicular and parallel to that portion of the active layer 17 which is below the botton of the groove 15, respectively. It has been confirmed that the laser diode had an excellent reproducibility of manufacture. This is because the layers 12 to 14 and 16 to 18 have constant and readily controllable thicknesses.

While this invention has thus far been described in specific conjunction with a single preferred embodiment thereof, it will now be readily possible for one skilled in the art to put this invention into effect in various other manners. Above all, numerical values and materials used as the substrate 11, the layers 12 to 14 and 16 to 18, and the dopants can be changed to other numerical values and other materials in compliance with laser diodes which are desirable. More specifically, the substrate 11 and the layers 12 to 14, 16, and 18 can have conductivity types which are opposite to the types described heretobefore.

What is claimed is:

1. In a semiconductor laser comprising a semiconductor substrate having a first conductivity type and a corrugated surface, an optical waveguide layer having said first conductivity type and a greater refractive index than said substrate, a first stack which comprises a current confining layer having a second conductivity type and a smaller refractive index than said waveguide layer and a current blocking layer of said first conductivity type and which has a pair of inwardly directed surfaces defining a groove therein and dividing said blocking layer and said confining layer into two current blocking parts and two current confining parts, respectively with an area of said waveguide layer exposed as a groove bottom, and a second stack which consecutively comprises a first cladding layer having said first conductivity type and a smaller refractive index than said waveguide layer, an active layer having a greater refractive index than said waveguide layer, and a second cladding layer having said second conductivity type and a smaller refractive index than said waveguide layer, said waveguide layer being on said corrugated surface, said current confining layer being on said waveguide layer, said first cladding layer being on said current blocking parts, said inwardly directed surfaces, and said groove bottom.

2. A semiconductor laser as claimed in claim 1, wherein said groove is perpendicular to corrugations of said corrugated surface.

3. A semiconductor laser as claimed in claim 2, wherein said waveguide layer and said first and said second stacks are successively grown by metal organic chemical vapor deposition.

4. A semiconductor laser as claimed in claim 3, wherein said groove bottom has a width of about 1.5 microns.

5. A semiconductor laser as claimed in claim 4, wherein said groove is formed by chemical etching of said first stack with photolithography applied.

* * * * *